(12) United States Patent
Ichimura

(10) Patent No.: US 11,430,707 B2
(45) Date of Patent: Aug. 30, 2022

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventor: Yuji Ichimura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 297 days.

(21) Appl. No.: 16/522,038

(22) Filed: Jul. 25, 2019

(65) Prior Publication Data
US 2020/0091025 A1    Mar. 19, 2020

(30) Foreign Application Priority Data
Sep. 19, 2018    (JP) .............................. JP2018-174959

(51) Int. Cl.
*H01L 23/31*      (2006.01)
*H01L 21/48*      (2006.01)
(Continued)

(52) U.S. Cl.
CPC ...... *H01L 23/3121* (2013.01); *H01L 21/4853* (2013.01); *H01L 21/52* (2013.01);
(Continued)

(58) Field of Classification Search
CPC ............. H01L 23/3121; H01L 23/5383; H01L 23/492; H01L 23/145; H01L 23/053; H01L 21/4853; H01L 21/52; H01L 21/56; H01L 24/48; H01L 2224/48157; H01L 24/73; H01L 24/92; H01L 2224/73265; H01L 2224/92247; H01L 2224/48091; H01L 2224/48227; H01L 2224/85205; H01L 2224/48137; H01L 2924/19107;
(Continued)

(56) References Cited

U.S. PATENT DOCUMENTS

2013/0012621 A1    1/2013  Yamamoto et al.
2013/0334672 A1    12/2013 Denta et al.
(Continued)

FOREIGN PATENT DOCUMENTS

JP    2006-286679 A    10/2006
JP    2011-176024 A    9/2011
(Continued)

*Primary Examiner* — Benjamin Tzu-Hung Liu

(57) ABSTRACT

The semiconductor device includes an insulating circuit substrate mounted with a semiconductor element; an external terminal; a base including a support portion; an adhesive sheet; and a sealing portion covering the semiconductor element. The support portion has a first surface, a second surface on the side opposite to the first surface, and a first opening opened at the first surface and the second surface. The insulating circuit substrate is disposed in the first opening. The adhesive sheet is disposed on the second surface of the support portion and has a second opening in which the semiconductor element is disposed in plan view. The adhesive sheet is projected into the first opening in plan view and adhered to a circuit block. The external terminal is adhered on the adhesive sheet and has a connecting surface to which a bonding wire is connected.

10 Claims, 6 Drawing Sheets

(51) Int. Cl.

| | |
|---|---|
| *H01L 21/52* | (2006.01) |
| *H01L 21/56* | (2006.01) |
| *H01L 23/053* | (2006.01) |
| *H01L 23/14* | (2006.01) |
| *H01L 23/492* | (2006.01) |
| *H01L 23/538* | (2006.01) |
| *H01L 23/00* | (2006.01) |

(52) U.S. Cl.
CPC ............ *H01L 21/56* (2013.01); *H01L 23/053* (2013.01); *H01L 23/145* (2013.01); *H01L 23/492* (2013.01); *H01L 23/5383* (2013.01); *H01L 24/48* (2013.01); *H01L 2224/48157* (2013.01)

(58) Field of Classification Search
CPC ... H01L 23/13; H01L 23/49861; H01L 23/10; H01L 23/24; H01L 23/057; H01L 25/18; H01L 23/49; H01L 21/4889
See application file for complete search history.

(56) References Cited

U.S. PATENT DOCUMENTS

| | | |
|---|---|---|
| 2014/0231975 A1 | 8/2014 | Denta et al. |
| 2015/0371931 A1* | 12/2015 | Nishida ................... H01L 24/48 |
| | | 174/255 |
| 2016/0254215 A1 | 9/2016 | Sato |

FOREIGN PATENT DOCUMENTS

| | | |
|---|---|---|
| JP | 2014-157925 A | 8/2014 |
| JP | 2018-29149 A | 2/2018 |
| WO | 2012/137685 A1 | 10/2012 |
| WO | 2015/166696 A1 | 11/2015 |

\* cited by examiner

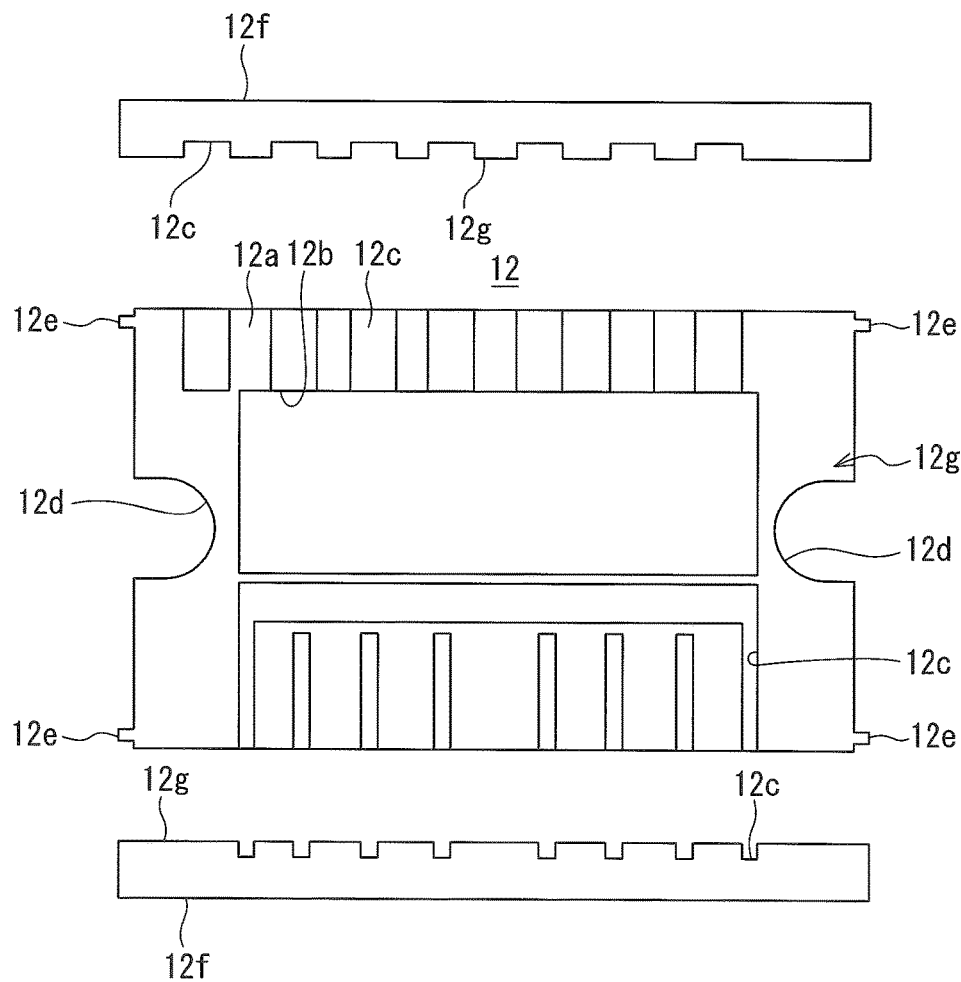

SEMICONDUCTOR DEVICE AND METHOD OF MANUFACTURING SEMICONDUCTOR DEVICE

CROSS-REFERENCE TO RELATED APPLICATIONS

This application claims benefit of priority under 35 U.S.C. § 119 to Japanese Patent Application No. 2018-174959, filed on Sep. 19, 2018, the entire contents of which is incorporated by reference herein.

BACKGROUND OF THE INVENTION

Field of the Invention

The present disclosure relates to a semiconductor device and a method of manufacturing a semiconductor device.

Description of the Related Art

There has conventionally been proposed an intelligent power module (IBM) which is a semiconductor device mounted with a semiconductor element and a peripheral circuit having optimal protection and drive functions (JP 2014-157925 A, WO 2015/166696 and WO 2012/137685). This type of semiconductor device has a structure in which a semiconductor element, a control circuit, and so on are mounted in a terminal case formed by insert molding using external terminals, and these mounted members are sealed by a sealing portion made of a resin material.

A general resin material for injection molding (e.g. polyphenylene sulfide (PPS) resin) cannot be used for adhesion to a metal terminal directly by chemical bonding. Therefore, in a semiconductor device 101 using a conventional terminal case 110 illustrated in FIG. 11, fine irregularities are provided on surfaces of metal terminals 113 to ensure close adhesion between a sealing portion 140 made of a resin material and the metal terminals 113 by the anchoring of effect of the resin material on the irregular surfaces of the metal terminals 113. However, the close adhesion between the sealing portion 140 and the metal terminals 113 achieved by such an anchoring effect is riot sufficient for the terminal case 110 so that there is a possibility of separation of the sealing portion 140 and the metal terminals 113 at their interface to form gaps therebetween in the heat cycle. In this case, in wire bonding to the metal terminals 113, the dislocation of the metal terminals 113 occurs due to ultrasonic waves emitted by a wire bonder. As a result, the wire bonding properties are degraded. Likewise, the close adhesion between the sealing portion 140 and the metal terminals 113 s also reduced. As a result, there is a possibility that the sealing portion 140 comes off the metal terminals 113.

In order to prevent such separation of the sealing portion 140 and the metal terminals 113 at their interface, there is a proposal for a structure in which members such as dowels 115a, 115b for external terminal fixation are provided as illustrated in FIG. 11. However, there are cases where the members such as the dowels 115a, 115b serve as obstacles that hinder adhesion to the resin material forming the sealing portion 140, resulting in that separation between the sealing portion 140 and the metal terminals 113 tends to occur.

Further, there is a proposal for a semiconductor device manufacturing method that uses a resin sheet (adhesive sheet) when manufacturing such a semiconductor device (JP 2018-29149 A, JP 2006-286679 A, JP 2011-176024 A). In the proposed semiconductor device manufacturing method, a resin sheet is used for preventing a reduction in withstand voltage that is caused due to difficulty for a molten casting resin to flow in smoothly at the time of transfer molding, or is used for adhesion between and insulation between metal external terminals and a substrate (circuit substrate or heatsink).

However, only by simply using the resin sheet, adhesion between a resin terminal case and the external terminals is not so sufficient that there is a possibility that the dislocation of the external terminals occurs in the manufacture of a semiconductor device.

SUMMARY

In view of the above problems, it is an object of the present disclosure to provide a semiconductor device in which a metal terminal is fixed in a terminal case without a complicated manufacturing process, and a method of manufacturing such a semiconductor device.

In order to solve the above problems, one aspect of a semiconductor device according to the present disclosure includes: (a) an insulating circuit substrate mounted with a semiconductor element; (b) an external terminal; (c) abase including a support portion; (d) an adhesive sheet; and (e) a sealing portion covering the semiconductor element, wherein: (f) the support portion has a first surface, a second surface on the side opposite to the first surface, and a first opening opened at the first surface and the second surface, the insulating circuit substrate disposed in the first opening; (g) the adhesive sheet is disposed on the second surface of the support portion and has a second opening in which the semiconductor element is disposed in plan view, the adhesive sheet projected into the first opening in plan view and adhered to the insulating circuit substrate; and (h) the external terminal is adhered on the adhesive sheet and has a connecting surface to which a bonding wire is connected.

One aspect of a semiconductor device manufacturing method according to the present disclosure includes: (i) preparing an insulating circuit substrate mounted with a semiconductor element, a base including a support portion having a first opening in which the insulating circuit substrate is allowed to be disposed, an adhesive sheet having a second opening, and an external terminal having a connecting surface to which a bonding wire is to be connected; (j) disposing the support portion and the adhesive sheet so that the second opening is superimposed on the first opening and that part of the adhesive sheet is located on the inner side of the first opening in plan view; (k) disposing the external terminal on the adhesive sheet to form a laminate; (l) turning the laminate upside down so that a surface of the adhesive sheet faces downward, and disposing the upside-down laminate on a first metal block to bring the surface of the adhesive sheet into contact with the first metal block; (m) inserting the insulating circuit substrate into the first opening by keeping a surface, mounted with the semiconductor element, of the insulating circuit substrate to face downward; (n) disposing a second metal block on upper surfaces of the insulating circuit substrate and the support portion to bring the second metal block into contact with the insulating circuit substrate; (o) applying heat pressing to the laminate and the insulating circuit substrate by the first metal block and the second metal block to cure the adhesive sheet; and (p) sealing the semiconductor element with a resin material to form a sealing portion.

With a semiconductor device and a method of manufacturing a semiconductor device according to the present disclosure, it is possible to obtain a semiconductor device in which a metal terminal is fixed in a terminal case without a complicated manufacturing process.

BRIEF DESCRIPTION OF DRAWINGS

FIGS. 3A, 3B, and 3C are respectively a plan view and side views for schematically explaining an outline of the configuration of an adhesive sheet that is used in the semiconductor device according to the embodiment;

DESCRIPTION OF THE PREFERRED EMBODIMENTS

Figure 1:
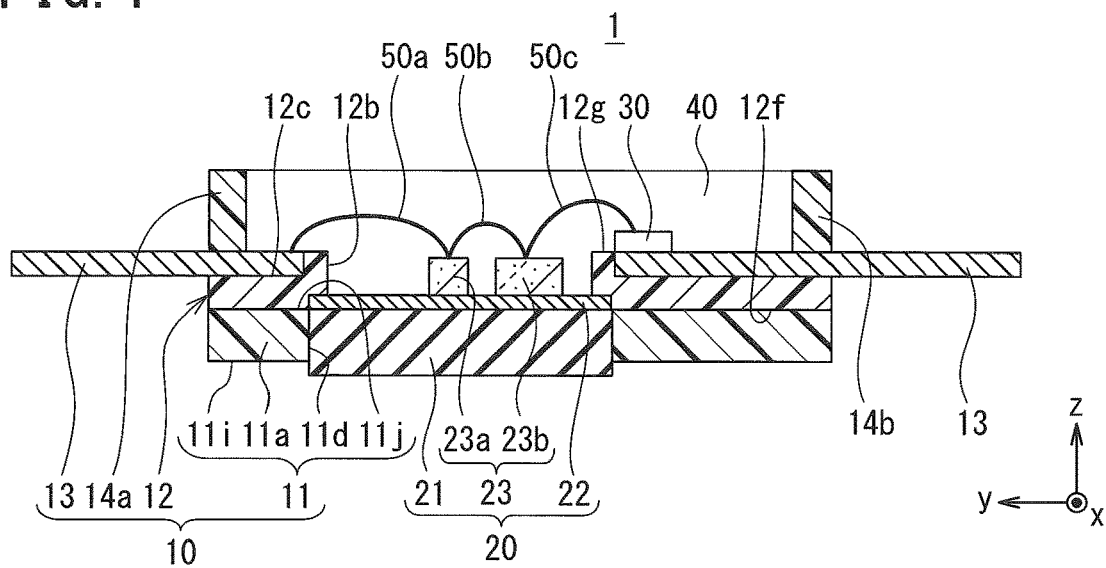
FIG. 1 is a sectional view for schematically explaining an outline of the configuration of a semiconductor device according to an embodiment.

Hereinafter, an embodiment of the present disclosure will be described. In the following description of the drawings, the same or like symbols will be assigned to the same or like portions. However, it is to be noted that the drawings are only exemplary and therefore the relationship between thickness and planar dimensions, the ratio of thicknesses of devices or members, and so on differ from actual ones. Accordingly, the specific thickness and dimensions should be determined by taking into account the following description. Further, naturally, portions with different dimensional relationships or ratios are included also between the drawings.

In the following description, the directions of "left and right" and "up and down" are defined merely for convenience of description and are not intended to limit the technical ideas of the present disclosure thereto. Therefore, for example, it is natural that when the drawing sheet is turned by 90 degrees, "left and right" and "up and down" should be exchanged one for the other, and that when the drawing sheet is turned by 180 degrees, "left" should become "right" and "right" should become "left". Further, as a matter of convenience, the longitudinal direction, the lateral direction, and the height direction of a semiconductor device are respectively defined as an x-axis direction, a y-axis direction, and a z-axis direction. In some cases, the x-axis direction will be referred to as a left-right direction, the y-axis direction as a front-rear direction, and the z-axis direction as an up-down direction. The x-axis, the y-axis, and the z-axis are set in directions forming a right-handed orthogonal coordinate system. The correspondence relationship between the x-, y-, and z-axis directions may change depending on a state of the semiconductor device. In this specification, plan view means a case where the semiconductor device is viewed from a positive or negative direction of the z-axis.

1. Semiconductor Device

Figure 2:
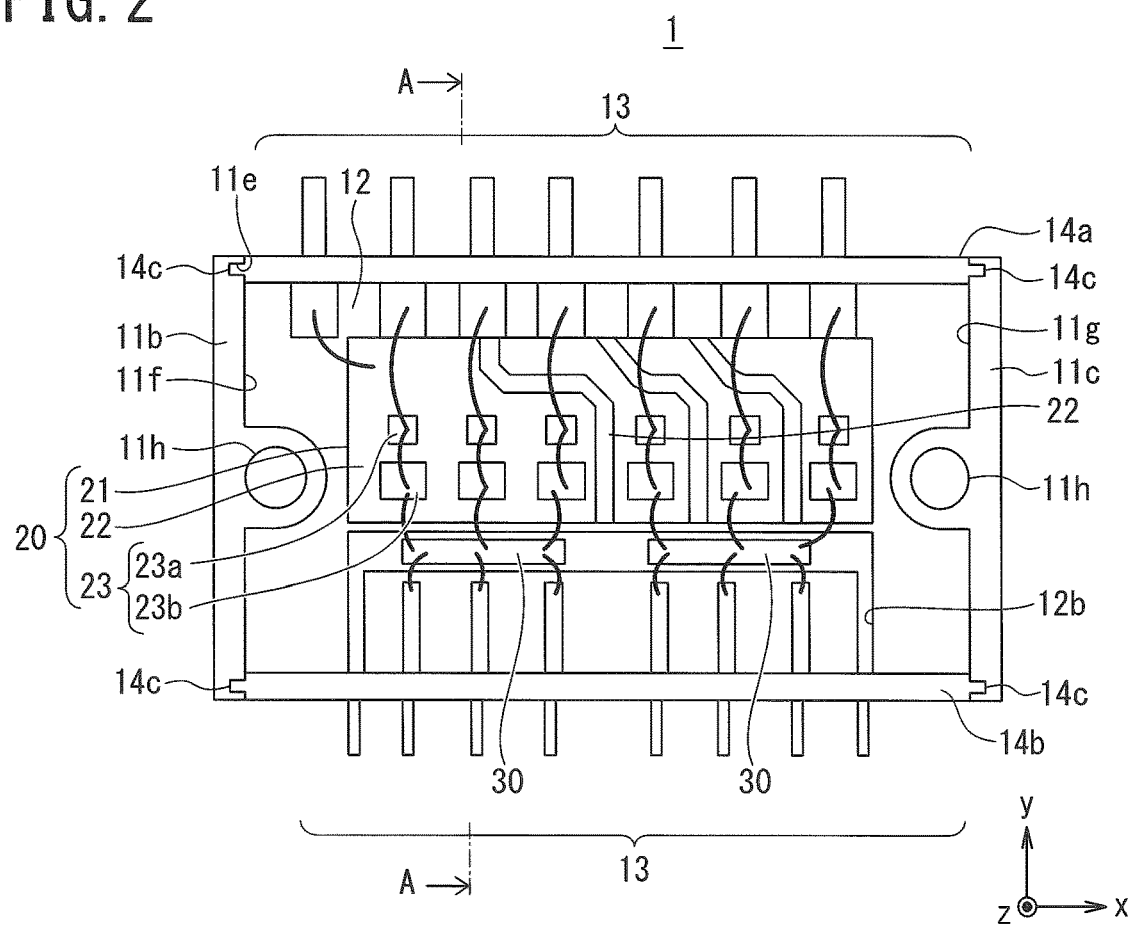
FIG. 2 is a plan view for schematically explaining the outline of the configuration of the semiconductor device according to the embodiment.

As illustrated in FIGS. 1 and 2, a semiconductor device 1 according to an embodiment of the present disclosure includes a terminal case 10 having external terminals 13, a circuit block 20 disposed in an opening 11$d$ of the terminal case 10 and mounted with semiconductor elements on an insulating substrate 21, control circuit chips 30 disposed on the external terminals 13, and a sealing portion 40 covering and protecting the semiconductor elements. The semiconductor device 1 is, for example, a power semiconductor device that has a power circuit including power semiconductor elements and is applied to an intelligent power module applicable to an inverter or the like. FIG. 1 is a sectional view taken along line A-A of the semi conductor device 1 illustrated in FIG. 2.

Terminal Case

The terminal case 10 includes a base 11, an adhesive sheet 12 disposed on the base 11, and fixing plates 14$a$, 14$b$ that are fixed to the external terminals 13 disposed on the adhesive sheet 12 and to part of the base 11. Side surfaces of the terminal case 10 form side surfaces of the semiconductor device 1. Further, a bottom surface of the terminal case 10 forms part of a bottom surface of the semiconductor device 1.

Base of Terminal Case

The base 11 of the terminal case 10 includes a support portion 11$a$ supporting the adhesive sheet 12 and so on, and side wall portions 11$b$, 11$c$. The side wall portions 11$b$, 11$c$ may each be included a recessed portion having a predetermined depth from an upper surface of the side wall portion 11$b$, 11$c$ or included a screw fastening hole 11$h$ in the form of a through-hole extending from an upper surface of the side wall portion 11$b$, 11$c$ and penetrating the support portion 11$a$. A screw is inserted through the screw fastening hole 11$h$ for fastening the semiconductor device 1 to an external device such as a printed board or a cooler (not illustrated).

The support portion 11$a$ is a support base member included with the opening 11$d$ and having, for example, a substantially rectangular external shape. The support portion 11$a$ has a first surface 11$i$ and a second surface 11$j$ on the side opposite to the first surface 11$i$. The second surface 11$j$ serves as a surface on which the adhesive sheet 12 is disposed. The opening 11d is opened at the first surface 11i and the second surface 11j. The opening 11d has a shape corresponding to the external shape of the circuit block 20 mounted with semiconductor chips 23. As a result, the insulating substrate 21 of the circuit block 20 is fixed in the opening 11d. The shape of the opening 11d may be substantially rectangular in plan view.

It is satisfactory for the support portion 11a to have strength that is sufficient for a terminal case. The support portion 11a is made of, for example, a resin material. Specifically, use is made of a resin material such as a thermosetting resin that allows formation of the support portion 11a by injection molding, or a UV-curable resin that allows formation of the support portion 11a by UV-molding. For example, the support portion 11a is made of one or a plurality of resin materials selected from a polyphenylene sulfide (PPS) resin, a polybutylene terephthalate (PBT) resin, a polyamide (PA) resin, an acrylonitrile butadiene styrene (ABS) resin, an acrylic resin, and so on. Among them, the polyphenylene sulfide (PPS) resin is particularly preferable.

The side wall portions 11b, 11c are provided to respectively rise from two facing sides (e.g. both end portions in the longitudinal direction) of the support portion 11a, and form part or the side surfaces of the semiconductor device 1. The side wall portions 11b, 11c are a first side wall portion and a second side wall portion in the semiconductor device 1 of this embodiment. The side wall portions 11b, 11c rise perpendicularly in the positive direction of the z-axis from the two facing sides of the support portion 11a. The side wall portions 11b, 11c are formed integrally with the support portion 11a, for example, by injection molding. That is, the side wall portions 11b, 11c are made of the same resin material or the like as the support portion 11a. Consequently, it is possible to obtain the high-strength terminal case 10 with high joint strength between the support portion 11a and the side wall portions 11b, 11c.

The side wall portions 11b, 11c are formed with engaging grooves 11e for engaging the fixing plates 14a, 14b. For example, the side wall portions 11b, 11c are formed with the four engaging grooves 11e in total with which both ends of the two fixing plates 14a, 14b are engaged for fixation of the fixing elates 14a, 14b to the side wall portions 11b, 11c. The engaging grooves 11e are provided on inner wall surfaces 11f, 11g of the side wall portions 11b, 11c. The inner wall surface 11f represents a surface of the side wall portion 11b on the side wall portion 11c side, and the inner wall surface big represents a surface of the side wall portion 11c on the side wall portion 11c side. The engaging grooves 11e are provided at facing positions of the inner wall surfaces 11f, big of the side wall portions 11b, 11c. As a result, both ends of each of the fixing plates 14a, 14b are engaged with the corresponding engaging grooves 11e so as to be fixed.

The engaging grooves 11e each have a shape corresponding to a shape of an engaging lug 14c provided at each of both ends of the fixing plates 14a, 14b, which will be described later. For example, the engaging groove 11e has a recessed shape corresponding to a protruding shape of the engaging lug 14c of the fixing plate 14a, 14b. As a result, the engaging lug 14c of the fixing plate 14a, 14b is engaged with the engaging groove 11e with no gap therebetween. Consequently, the fixing plates 14a, 14b are stably fixed to the side wall portions 11b, 11c. By the engagement of the fixing plates 14a, 14b with the side wall portions 11b, 11c, a frame body is formed on the support portion 11a. The frame body forms part of the side surfaces or the semiconductor device 1. The frame body serves to prevent, the outflow of a molten casting resin that will be used later when forming the sealing portion 40.

The side wall portions 11b, 11c may be provided on the support portion 11a so as to extend away from each other or toward each other from the support portion 11a. Provided that the side wall portions 11b, 11c can prevent the outflow of a molten casting resin and have strength sufficient for a terminal case that forms the semiconductor device 1, the side wall portions 11b, 11c may be formed as separate members from the support portion 11a and fixed to the support portion 11a. In this case, the side wall portions 11b, 11c are made of a resin material such as a thermosetting resin that allows formation the side wall portions 11b, 11c by injection molding, or a UV-curable resin that al lows formation the side wall portions 11b, 11c by UV-molding. The side wall portions 11b, 11c may be made of the same material as the support portion 11a or a different material from the support portion 11a.

Fixing Plate

The fixing plates 14a, 14b are each a plate member having a substantially rectangular shape. The fixing plates 14a, 14b are a first fixing plate and a second fixing plate in the semiconductor device 1 of this embodiment. Both end portions of each of the fixing plates 14a, 14b in the longitudinal direction are fixed to the side wall portions 11b, 11c. Inner surfaces of the fixing plates 14a, 14b are adhere closely to the sealing portion 40, and upper surfaces of the fixing plates 14a, 14b form part of an upper surface of the semiconductor device 1. Outer surfaces of the fixing plates 14a, 14b form part of the left and right side surfaces of the semiconductor device 1 illustrated in FIG. 1.

The engaging lugs 14c having the shape corresponding to the shape of the engaging grooves 11e of the side wall portions 11b, 11c are provided at both end portions of the fixing plates 14a, 14b in the longitudinal direction. The engaging lugs 14c may have any shape as long as the engaging lugs 14c have a size and shape that can prevent the outflow of a molten casting resin and that allow engagement of the engaging lugs 14c with the side wall portions 11b, 11c with strength sufficient for a terminal case that forms the semiconductor device 1.

The fixing plates 14a, 14b are fixed to the side wall portions 11b, 11c without forming a gap between the adhesive sheet 12 disposed on the support portion ala and the external terminals 13 disposed on a surface of the adhesive sheet 12. This makes it possible to prevent the outflow of a molten casting resin when forming the sealing portion 40.

The fixing plates 14a, 14b may be fixed to the side wall portions 11b, 11c in such a way as to press the adhesive sheet 12 and the external terminals 13 against the support portion 11a. This improves close adhesion between the support portion 11a, the adhesive sheet 12, and the external terminals 13. As a result, the effect of fixing the external terminals 13 is improved.

It is satisfactory for the fixing plates 14a, 14b to have strength enough to prevent the outflow of molten casting resin. The fixing plates 14a, 14b are made of, for example, a resin material. Specifically, use is made of a resin material such as a thermosetting resin that allows formation of the fixing plates 14a, 14b by injection molding, or a UV-curable resin that allows formation of the fixing plates 14a, 14b by UV-molding. For example, the fixing plates 14a, 14b are made of a polyphenylene sulfide (PPS) resin or the like.

The fixing plates 14a, 14b do not necessarily have the engaging lugs 14c, and both end portions, facing the side wall portions 11b, 11c, of the fixing plates 14a, 14b may serve as the engaging lugs 14c. in this case, the engaging grooves 11e of the side wall portions 11b, 11c have a shape corresponding to a shape of the end portions of the fixing plates 14a, 14b.

Adhesive Sheet

FIGS. 3A, 3B, and 3C are respectively a plan view and side views illustrating the configuration of the adhesive sheet 12. FIG. 3A is a plan view illustrating the configuration of the adhesive sheet 12 and illustrates the configuration of a fourth surface 12g, which will be described later, of the adhesive sheet 12. FIG. 3B is a side view illustrating one of the long side surfaces of the adhesive sheet 12, from which the external terminals 13 for a power circuit are drawn out. FIG. 3C is a side view illustrating the other long side surface of the adhesive sheet 12, from which the external terminals 13 for control signals are drawn out.

As illustrated in FIG. 3A, the adhesive sheet 12 is a sheet member included an opening 12b and having, for example, a rectangular shape. The opening 12b is a second opening in the semiconductor device 1. As illustrated in FIG. 1 and FIGS. 3B and 3C, the adhesive sheet. 12 is disposed on the second surface 11j of the support portion 11e. The adhesive sheet 12 has a third surface 12f facing the second surface 11j of the support portion 11a, and the fourth surface 12g on the side opposite to the third surface 12f. Part of the circuit block 20 (part of an insulating circuit substrate formed by the insulating substrate 21 and a conductor layer 22, which will be described later) disposed in the opening 11d of the support portion 11a adhere to the adhesive sheet 12. The adhesive sheet 12 is disposed on the second surface 11j of the support portion 11a in such a way that the opening 12b is superimposed on the opening 11d of the support portion 11a. That is, in plan view, the adhesive sheet 12 is projected into the opening 11d of the support portion and adhered to the insulating circuit substrate.

The shape of the opening 12b is of no particular concern but is preferably lightly smaller than the opening 11d of the support portion 11a (the external shape of the circuit block 20) such that the opening 12b in its entirety overlaps the opening 11d of the support portion 11a. That is, preferably, in plan view, the adhesive sheet 12 is projected into the opening 11d of the support portion 11a from the entire periphery of the opening 11d, and the entire periphery of the opening 12b is located on the inner side of the opening 11d. Further, more preferably, the center of the opening 12b and the center of the opening 11d are aligned with each other. Consequently, since the adhesive sheet 12 is projected into the opening 11d of the support portion 11a from the entire periphery of the opening 11d in plan view and the entire outer peripheral portion of the circuit block 20 is adhered closely to the adhesive sheet 12, the adhesive sheet 12 and the circuit block 20 are firmly fixed to each other. The shape of the opening 12b may be substantially rectangular in plan view.

The adhesive sheet 12 is made of, for example, a resin material excellent in adhesion to both a material forming the support portion 11a and a metal material forming the external terminals 13. For example, the support portion 11a is preferably made of a resin material, and the external terminals 13 are generally made of a metal material. In this case, the adhesive sheet 12 is preferably made of a resin material for transfer molding that is excellent in adhesion to both the support portion 11a and the external terminals 13. While a generally known material is used as the resin material for transfer molding, it is preferable that the glass transition temperature be equal to or higher than 125° C. and less than 200° C., the thermal expansion coefficient be equal to or greater than 14 ppm/(° C. and equal to or less than 26 ppm/° C., and the gelation time (GT) be within 60 seconds at 175° C. Using such a resin material, the external terminals 13 and the circuit block 20 have properly adhered to the adhesive sheet 12 in heat pressing, which will be described later. For example, an epoxy resin is preferably used as the resin material for transfer molding. The epoxy resin is preferable because it acts as an adhesive with chemical bonding to various materials and its adhesive strength to a metal is higher than 10 MPa.

Preferably, a sheet portion 12a, being a region other than the opening 12b, of the adhesive sheet 12 is included recessed portions 12c having shapes corresponding to shapes of the external terminals 13. The recessed portions 12c are provided on the fourth surface 12g (the surface on the side opposite to the surface facing the support portion 11a) of the adhesive sheet 12. Since the external terminals 13 are fitted into the recessed portions 12c, it is possible to prevent the dislocation of the external terminals 13 in the Hey plane direction. Therefore, it is possible to solve the conventional problem that the dislocation of the external terminals occurs due to ultrasonic waves emitted by the wire bonder in wire bonding, and accordingly, it is possible to improve the wire bonding properties.

Preferably, the adhesive sheet 12 having the recessed portions 12c is formed to be thicker than the external terminals 13 by approximately 200 μm. That is, when the thickness of the external terminal 13 is 1.0 mm, the adhesive sheet 12 having the recessed portions 12c is preferably configured such that the thickness of the sheet portion 12a formed with the recessed portion 12c is 200 μm and that the thickness of the sheet portion 12a not formed with the recessed portion 12c is 1.2 mm.

Further, cut-out portions 12d corresponding to the screw fastening holes 11h and protruding portions 12e corresponding to the engaging grooves 11e are formed at end portions, abutting the side wall portions 11b, 11c, of the adhesive sheet 12. Consequently, the adhesive sheet 12 is disposed on the base 11 with no gap therebetween. As a result, it is possible to prevent the dislocation of the adhesive sheet 12 on the base 11.

Close adhesion between the adhesive sheet 12 and the external terminals 13 is improved by performing a method such as heating in the state where the external terminals 13 are disposed on the recessed portions 12c. Consequently, it is possible to suppress that the adhesive sheet 12 is separated from the external terminals 13 to form gaps at their interface. As a result, it is possible to further prevent the dislocation of the external terminals 13 in the x-y plane direction. Further, it is possible to improve the breakdown lifetime of the semiconductor device 1 and prevent corrosion of the external terminals 13 due to entry of water through gaps. As a result, maintaining good electrical characteristics of the semiconductor chips 23 over a long period of time.

In particular, when heating or the like is performed in the state where the external terminals 13 are fitted into the recessed portions 12c, surfaces including side surfaces, facing the sheet portion 12a, of the external terminals 13 adhere closely to the adhesive sheet 12. As a result, close adhesion between the adhesive sheet 12 and the external terminals 13 is further improved. Consequently, the breakdown lifetime is further improved and the good electrical characteristics of the semiconductor chips 23 is maintained over a longer period of tame.

Since the external terminals 13 are fitted into the recessed portions 12c, the adhesive sheet 12 and the external terminals 13 are flush with each other. Consequently, a gap is unlikely to occur between the adhesive sheet 12/the external terminals 13 and the fixing plates 14a, 14b and the outflow of a molten casting resin is further suppressed.

The adhesive sheet 12 according to this embodiment makes it possible to fix the external terminals 13 without using members such as terminal fixing dowels. Therefore, projections likely to be obstacles that hinder adhesion to a sealing resin are not required for fixing the external terminals 13. Consequently, it is possible to prevent separation between the sealing portion 40 and the external terminals 13 and improving the reliability of the semiconductor device 1.

External Terminal

The external terminal 13 is made of a conductive material such as a metal and has a connecting surface to which a bonding wire (hereinafter referred to as a "wire") is connected. As the metal used for the external terminal 13, copper (Cu) or aluminum (Al) are exemplified. The external terminal 13 may be formed by applying metal plating, such as nickel (Ni) plating, to the metal cited above.

The external terminals 13 are adhesively disposed on the adhesive sheet 12 and drawn out to the outside from the inside of the semiconductor device 1. For example, the external terminals 13 are drawn out to the outside from both of the facing long sides of the rectangular adhesive sheet 12. In this case, for example, the control-signal external terminals 13 electrically connected to control circuits such as ICs, diodes such as bootstrap diodes (BSDs), or the like are drawn out from one of the long sides of the adhesive sheet 12, and the power-circuit external terminals 13 electrically connected to the semiconductor chips 23 including power semiconductor elements such as IGBTs are drawn out from the other long side of the adhesive sheet 12.

Circuit Block

The circuit block 20 includes the insulating substrate 21, the conductor layer 22 formed on the insulating substrate 21, and the semiconductor chips 23 including semiconductor elements. The insulating circuit substrate is formed by the insulating substrate 21 and the conductor layer 22. The insulating circuit substrate has a mounting surface on which the semiconductor chips 23 are mounted. The circuit block 20 is disposed in the opening 11d of the support portion 11a so that the surface mounted with the semiconductor chips 23 is located on the adhesive sheet 12 side. The opening 11d is a first opening in the semiconductor device 1. Consequently, the insulating circuit substrate adhere closely to the adhesive sheet 12 at the outer peripheral portion of the surface mounted with the semiconductor chips 23. Side surfaces of the circuit block 20 are in contact with the support portion 11a, and a bottom surface of the circuit block 20 is exposed from the bottom surface of the support portion 11a to form part of the bottom surface of the semiconductor device 1. The semiconductor chips 23 on the upper surface of the circuit block 20 are disposed in the opening 12b of the adhesive sheet 12 and adhered closely to the sealing portion 40.

The bottom surface of the circuit block 20 is disposed in the opening 11d of the support portion 11a to be flush with the bottom surface of the support portion 11a. Consequently, when heat pressing is performed in the manufacture of the semiconductor device 1, heating is carried out in the state where the circuit block 20 and the adhesive sheet 12 adhere closely to each other. As a result, close adhesion between the circuit block 20 and the adhesive sheet 12 is improved.

The bottom surface of the circuit block 20 may slightly protrude from the bottom surface of the support portion 11a In this case, since heating is carried out in the state where the bottom surface of the circuit block 20 is pressed by a pressing plate in heat pressing, close adhesion between the circuit block 20 and the adhesive sheet 12 is further improved.

Further, the bottom surface of the circuit block 20 may be recessed from the bottom surface of the support portion 11a. In this case, part of the pressing plate may be protruded, and carrying out heating in the state where the bottom surface of the circuit block 20 and the pressing plate adhere closely to each other.

Further, the surface, mounted with the semiconductor chips 23, of the circuit block 20 may be located on the first surface 11i side from the second surface 11j of the support portion 11a (i.e. in the opening 11d). In this case, part of the adhesive sheet 12 is projected into the opening 11d along side wails of the opening 11d, and the adhesive sheet 12 and the surface, mounted with the semiconductor chips 23, of the circuit block 20 adhere closely to each other in the opening 11d.

Insulating Substrate

The insulating substrate 21 is, for example, an aluminum (Al) insulating substrate or a direct copper bonding (DCB) substrate produced by a DCB method. In the semiconductor device 1 according to this embodiment, the aluminum insulating substrate is used by way of example.

Conductor Layer

The conductor layer 22 is a conductive wiring pattern formed in advance on a surface of the insulating substrate 21 and is made of, for example, aluminum (Al).

Semiconductor Chip

The semiconductor chip 23 includes, for example, a semiconductor chip 23a and a semiconductor chip 23b separate from the semiconductor chip 23a. The semiconductor chip 23a is, for example, a diode such as a freewheeling diode (FWD). The semiconductor chip 23b is a power semiconductor element. such as an insulated gate bipolar transistor (IGBT) or a metal oxide semiconductor field effect transistor (MOSFET). As illustrated in FIG. 1, the semiconductor chip 23a is electrically connected to the external terminal 13 by a wire 50a. The semiconductor chip 23a and the semiconductor chip 23b are electrically connected to each other by a wire 50b. The semiconductor chip 23b is electrically connected to the control circuit chip 30 by a wire 50c. In FIG. 2, reference symbols are omitted.

The semiconductor chip 23 may include a power semiconductor element and an element such as an FWD. The semiconductor chip 23 may be a reverse conducting IGBT (RC-IGBT) configured such that an IGBT and an FWD are formed into one chip. In the semiconductor chip 23, a power semiconductor element may be formed on a semiconductor substrate made of silicon (Si), silicon carbide (SiC) gallium nitride (GaN), or the like. Hereinafter, when making no distinction between the semiconductor chip 23a and the semiconductor chip 23b, the semiconductor chip 23a and the semiconductor chip 23b will be referred to as the semiconductor chips 23.

The semiconductor chips 23 are mounted on the conductor layer 22. The semiconductor chips 23 are electrically connected by the conductor layer 22 to form part of an inverter circuit or the like. The semiconductor chips 23 are connected to the power-circuit external terminals 13 and to the control circuit chips 30 by bonding wires The semiconductor chips 23 are covered with the sealing portion 40 to be electrically insulated from the surroundings.

Control Circuit Chip

The control circuit chip 30 includes a control circuit such as an IC for controlling a main circuit formed by semiconductor elements in the semiconductor chips 23. The control circuit chip 30 is provided on the external terminals 13. The control circuit chip 30 may have any configuration as long as it has a control function, a protection function, and so on that are necessary according to a use of the semiconductor device 1. The control circuit chip 30 is connected to the semiconductor chips 23 and to the control-signal external terminals 13 by bonding wires. The control circuit chip 30 is covered with the sealing portion 40 to be electrically insulated from the surroundings.

Sealing Portion

The sealing portion 40 is a layer that protects the external terminals 13, the circuit block 20, the semiconductor chips 23, the control circuit chips 30, and so on in the terminal case 10. An upper surface of the sealing portion 40 forms part of the upper surface of the semiconductor device 1. The sealing portion 40 is made of, for example, a resin material such as an epoxy resin, a silicone resin, or an urethane resin. The sealing portion 40 is formed by pouring a molten casting resin (epoxy resin, silicone resin, urethane resin, or the like) into the frame body formed by the side wall portions 11b, 11c and the fixing plates 14a, 14b and curing the molten casting resin by heating, UV irradiation, or the like.

In order to facilitate understanding of the configuration of the terminal case 10 of this embodiment, FIG. 2 illustrates the configuration of the semiconductor device 1 in plan view, with the sealing portion 40 removed.

2. Semiconductor Device Manufacturing Method

One example of a manufacturing method of the semiconductor device 1 illustrated in FIGS. 1 and 2 will be described with reference to a plan view and side views of the adhesive sheet 12 illustrated in. FIGS. 3A to 3C and manufacturing process diagrams of FIGS. 4A to 10B. Hereinafter, a method of manufacturing the semiconductor device 1 using the fixing plates 14a, 14b included the engaging lugs 14c at the end portions the fixing plates 14a, 14b, the side wall portions 11b, 11c included the engaging grooves 11e that are engageable with the engaging lugs 14c, and the adhesive sheet 12 formed on which recessed portions 12c having the shapes corresponding to the shapes of the external terminals 13 will be described.

FIGS. 4A, 5A, 6A, 7A, 8A, 9A, and 10A are plan views of the semiconductor device 1 in the manufacture of the semiconductor device 1. FIGS. 4B, 5B, 6B, 7B, 8B, 9B, and 10B are, respectively, sectional views taken along line B-B of FIG. 4A, line C-C of FIG. 5A, line D-D of FIG. 6A, line E-E of FIG. 7A, line F-F of FIG. 8A, line G-G of FIG. 9A, and line H-H of FIG. 10A.

First, the adhesive sheet 12 illustrated in FIGS. 3A to 3C is produced. The adhesive sheet 12 is formed by tableting a powder resin using a mold. The adhesive sheet 12 has the opening 12b, and the cut-out portions 12d and the protruding portions 12e in conformity with the shape of the side wall portions 11b, 11c. When providing the adhesive sheet 12 with the recessed portions 12c having the shapes corresponding to the shapes of the external terminals 13, the adhesive sheet 12 is formed by tableting a powder resin using a mold having protruding portions corresponding to the shapes of the external terminals 13. In this event, tableting is performed using the mold by setting the depth of the recessed portion. 12c to be equal to the thickness of the external terminal 13 and setting the thickness of the sheet portion 12a formed with the recessed portion 12c to 200 µm. Consequently, the thickness of the sheet portion 12a not formed with the recessed portion 12c becomes greater than the thickness of the external terminal 13 by 200 µm.

Figure 4A:
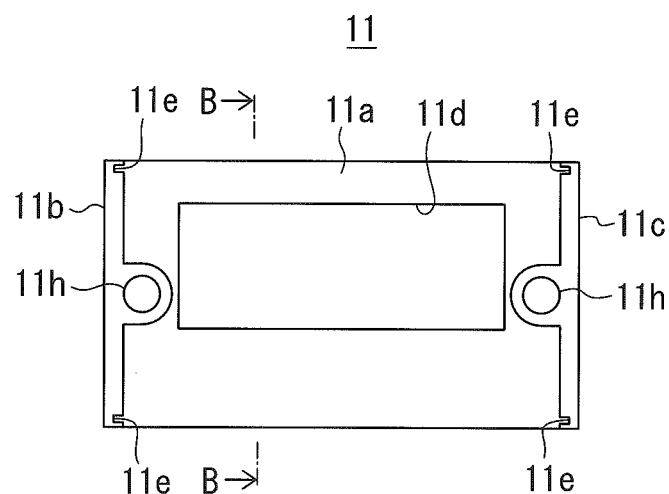
FIGS. 4A and 4B are respectively a plan view and a sectional view for schematically explaining an outline of a semiconductor device manufacturing method according to the embodiment.
Figure 4B:
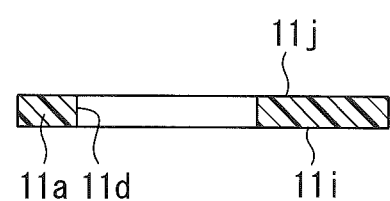

As illustrated in FIGS. 4A and 4B, the base 11 including the support portion 11a having the opening 11d in which the insulating circuit substrate is to be disposed is prepared. Further, the insulating circuit substrate mounted with the semiconductor chips 23 and the external terminals 13 each having the connecting surface to which a bonding wire is connected are separately prepared.

Figure 5A:
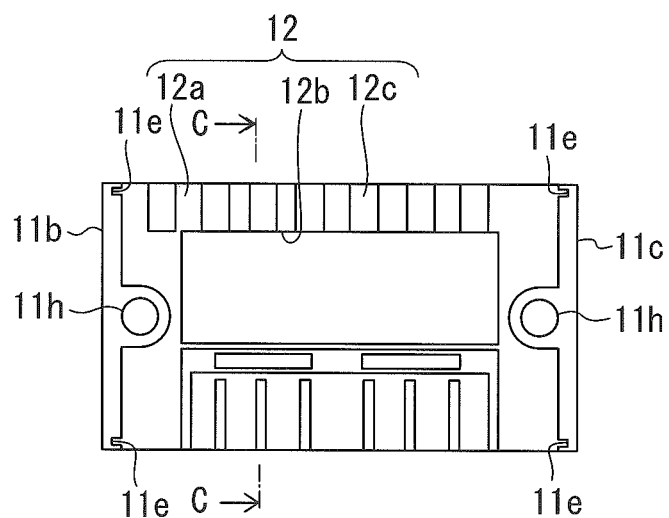
FIGS. 5A and 5B are respectively a plan view and a sectional view for schematically explaining the outline of the semiconductor device manufacturing method according to the embodiment.
Figure 5B:
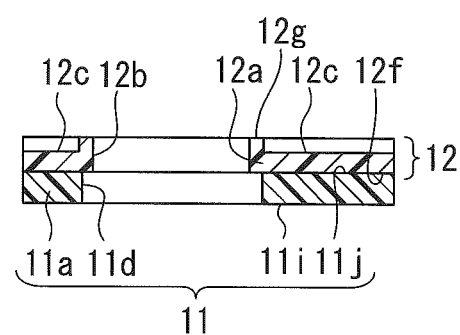

As illustrated in FIGS. 5A and 5B, the adhesive sheet 12 formed on which the recessed portions 12c is disposed on the support portion 11a of the base 11 and the recessed portions 12c face upward. In this event, the support portion 11a and the adhesive sheet 12 are disposed so that the opening 12b of the adhesive sheet 12 is superimposed on the opening 11d of the support portion 11a and that part of the adhesive sheet 12 is located on the inner side of the opening 11d in plan view. Further, the support portion 11a and the adhesive sheet 12 are disposed so that the cut-out portions 12d and the protruding portions 12e of the adhesive sheet 12 correspond to the screw fastening holes 11h and the engaging grooves 11e of the side wall portions 11b, 11c of the base 11.

Figure 6A:
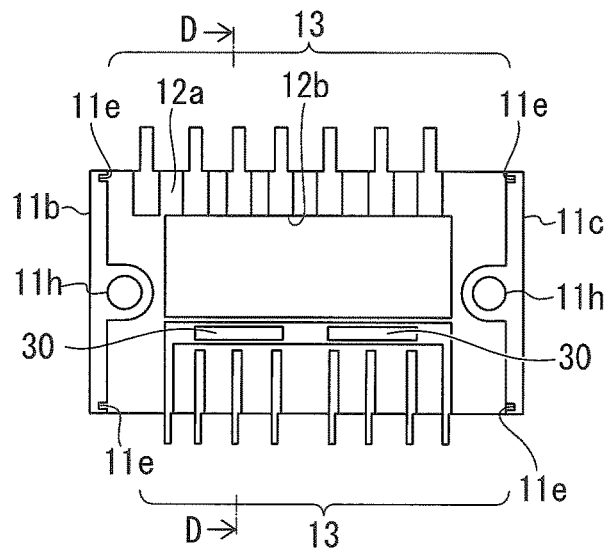
FIGS. 6A and 6B are respectively a plan view and a sectional view for schematically explaining the outline of the semiconductor device manufacturing method according to the embodiment.
Figure 6B:
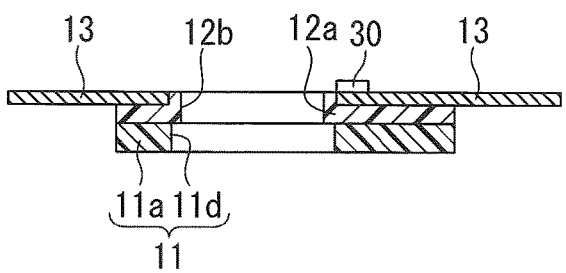

As illustrated in FIGS. 6A and 6B, the external terminals 13 are disposed to be fitted into the recessed portions 12c of the adhesive sheet 12 and forming a laminate of the base 11, the adhesive sheet 12, and the external terminals 13. The external terminals 13 are disposed so that the control-signal external terminals 13 are drawn out from one of the long sides of the adhesive sheet 12 and that the power-circuit external terminals 13 are drawn out from the other long side of the adhesive sheet 12. The control circuit chips 30 may be connected to the control-signal external terminals 13 in advance.

Figure 7A:
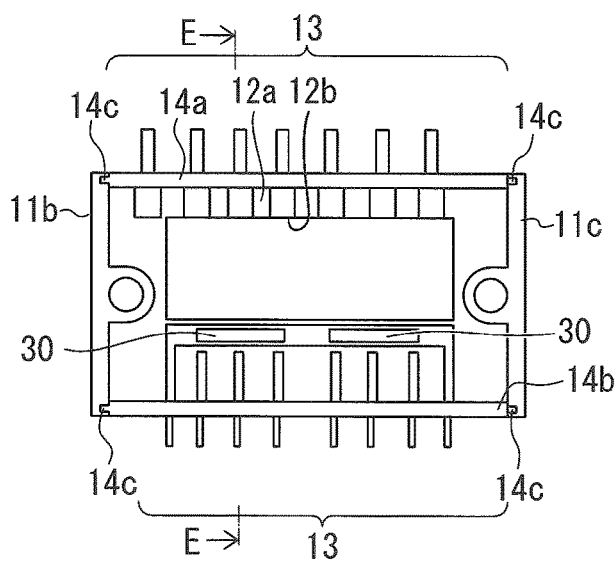
FIGS. 7A and 7B are respectively a plan view and a sectional view for schematically explaining the outline of the semiconductor device manufacturing method according to the embodiment.
Figure 7B:
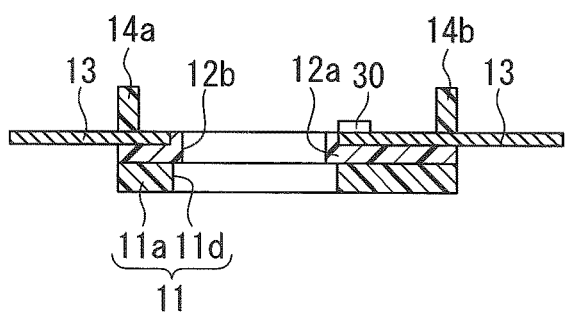

As illustrated in FIGS. 7A and 7B, the fixing plates 14a, 14b are fixed to the side wall portions 11b, 11c. In this event, the engaging lugs 14c provided at both ends of the fixing plates 14a, 14b in the longitudinal direction are respectively engaged with the engaging grooves 11e of the side wall portions 11b, 11c and fixing the fixing plates 14a, 14b to the side wall portions 11b, 11c.

Figure 8A:
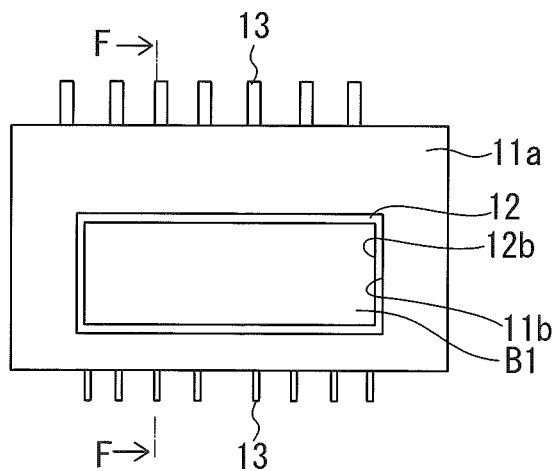
FIGS. 8A and 8B are respectively a plan view and a sectional view for schematically explaining the outline of the semiconductor device manufacturing method according to the embodiment.
Figure 8B:
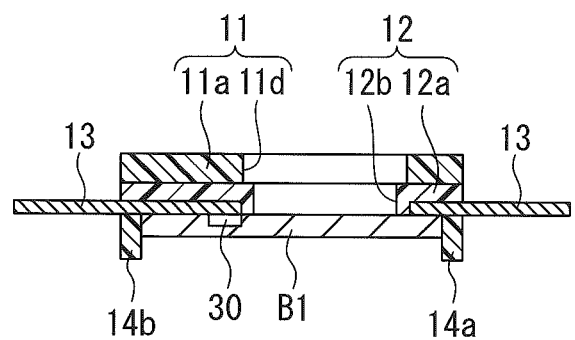

As illustrated in FIGS. 8A and 8B, a laminate in which the fixing plates 14a, 14b are fixed to the side wall portions 11b, 11c is turned upside down so that the surface, formed with the recessed portions 12c, of the adhesive sheet 12 faces downward. By disposing the upside-down laminate on a metal block B1 heated to 170° C. to 180° C., the surface, formed with the recessed portions 12c, of the adhesive sheet 12 is brought into contact with the metal block B1. The metal block B1 is a metal block of a size that is accommodated in the frame body formed by the side wall portions 11b, 11c and the fixing plates 14a, 14b. The metal block Bi is a first metal block of the semiconductor device manufacturing method in this embodiment.

Figure 9A:
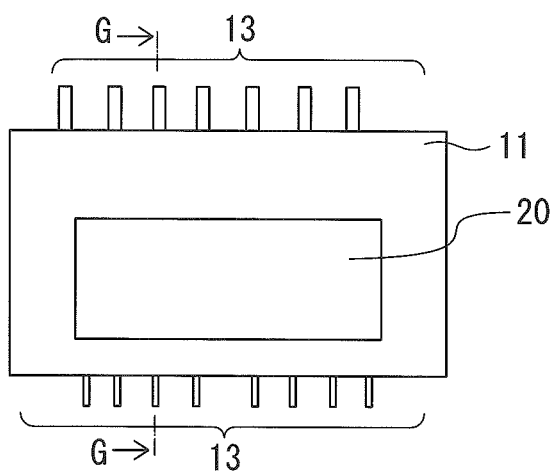
FIGS. 9A and 9B are respectively a plan view and a sectional view for schematically explaining the outline of the semiconductor device manufacturing method according to the embodiment.
Figure 9B:
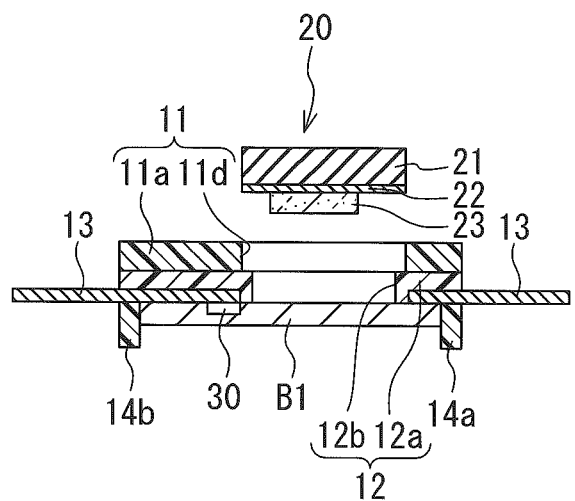

As illustrated in FIGS. 9A and 9B, the circuit block 20 in which the semiconductor chips 23 are soldered to the conductor layer 22 is inserted into the opening 11d from above the support portion 11a by keeping the semiconductor element mounted surface (the surface mounted with the semiconductor chips 23) to face downward. The semiconductor elements are disposed in the opening 12b of the adhesive sheet 12. In this event, since the adhesive sheet 12 is heated by the metal block B1, the circuit block 20 is inserted before the adhesive sheet 12 is cured, i.e. within the gelation time (GT).

Figure 10A:
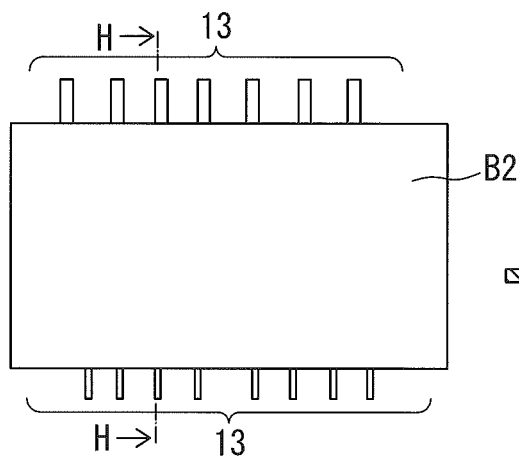
FIGS. 10A and 10B are respectively a plan view and a sectional view for schematically explaining the outline of the semiconductor device manufacturing method according to the embodiment.
Figure 10B:
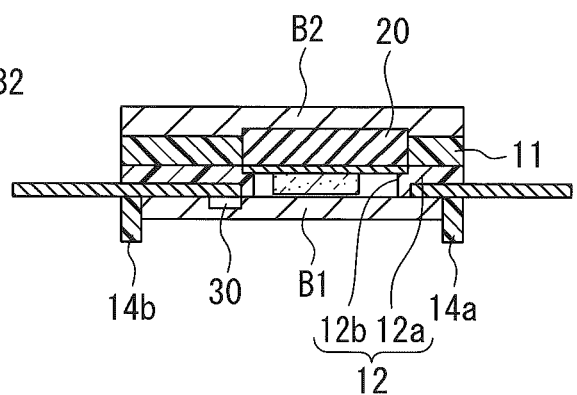
Figure 11:
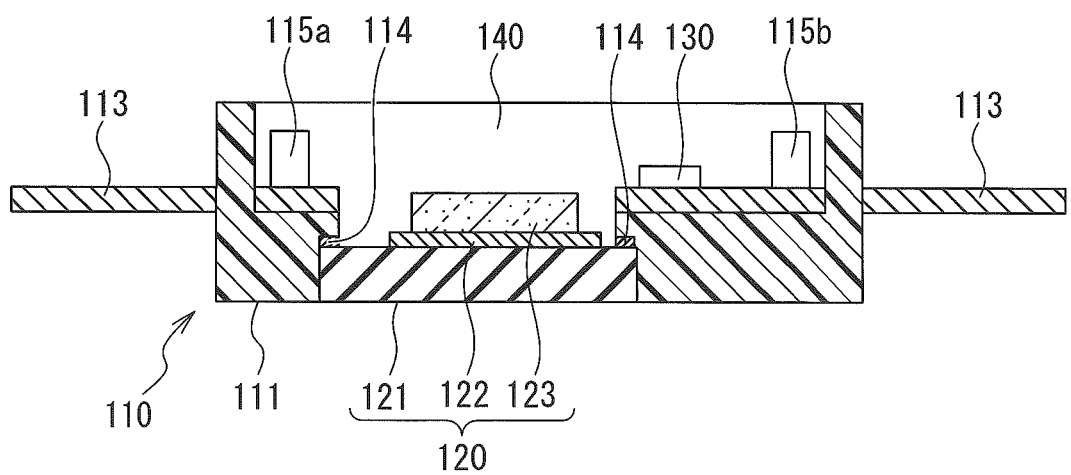
FIG. 11 is a sectional view for schematically explaining an outline of the configuration of a conventional semiconductor device.

As illustrated in FIGS. 10A and 10B, a metal block B2 heated to 170° C. to 180° C. like the metal block B1 is disposed on upper surfaces of the circuit block 20 and the support portion 11a and the circuit block 20 and the support portion 11a are brought into contact with. Consequently, heat pressing is applied to the laminate and the circuit block 20 by the metal block B1 and the metal block B2 to curing the adhesive sheet 12. As a result, the base 11 and the external terminals 13 are adhered to the adhesive sheet 12 and the terminal case 10 is formed. Further, the adhesive sheet 12 and the circuit block 20 are adhered to each other.

By inserting the circuit block 20 within the gelation time (GT) and performing heat pressing, part of the adhesive sheet 12 enters a gap between the side walls of the opening 11d of the base 11 and the side surfaces of the insulating substrate 21 of the circuit block 20. Therefore, the adhesive sheet 12 is adhered closely not only to the surface, formed with the conductor layer 22, of the insulating substrate 21, but also to the side surfaces of the insulating substrate 21. As a result, adhesion between the base 11 and the circuit block 20 is improved. Consequently, it is possible to suppress the occurrence of separation between the base 11 and the circuit block 20 even in the heat cycle of the semiconductor device 1. This is properly achieved by the projection of the adhesive sheet 12 into the opening 11d of the support portion 11a in plan view.

The metal block B2 is a second metal block of the semiconductor device manufacturing method in this embodiment. Heat pressing is performed for about two minutes when the temperature of the metal blocks B1 and B2 is 175° C. Preferably, the heating temperature and the heating time are adjusted as appropriate according to the material, thickness, and so on of the adhesive sheet 12. Consequently, the curing reaction of the adhesive sheet 12 is promoted to form the terminal case 10 including the adhesive sheet 12 and the external terminal 13 and to fix the terminal case 10 and the circuit block 20 to each other.

Finally, after the metal blocks B1 and B2 are removed, the terminal case 10 fitted with the circuit block 20 is disposed in a mold (not illustrated), and then a molten casting resin such as an epoxy resin is poured into the mold. In this event, the resin material is poured into the frame body of the base 11 with the fixing plates 14a, 14b fixed thereto. By heating the mold to cure the casting resin, the sealing portion 40 covering the inner surfaces of the terminal case 10 and the surface, mounted with the semiconductor chips 23, of the circuit block 20 is formed. By cutting connecting portions connecting the external terminals 13 (tie bar cutting process), the semiconductor device 1 illustrated in FIG. 1 is obtained.

Effects of Embodiment (1) By disposing the adhesive sheet 12 between the base 11 formed by in molding and the external terminals 13 and performing heat pressing, the semiconductor device 1 manufactured by the manufacturing method in this embodiment can improve adhesion between the base 11 and the external terminals 13 via the adhesive sheet 12. Therefore, in the semiconductor device 1 manufactured by the manufacturing method in this embodiment, the adhesive sheet 12 and the external terminals 13 have firmly adhered to each other and it is possible to suppress the formation of a gap at the interface between the adhesive sheet 12 and the external terminals 13.

(2) By suppressing the formation of a gap at the interface between the adhesive sheet 12 and the external terminals 13, it is possible to prevent the dislocation of the external terminals 13. Further, by suppressing the formation of a gap at the interface between the adhesive sheet 12 and the external terminals 13, it s possible to improve the breakdown lifetime of the semiconductor device 1.

(3) By suppressing the formation of a gap at the interface between the adhesive sheet 12 and the external terminals 13, it is possible to prevent, corrosion of the external terminals 13 due to entry of water through a gap. As a result, electrical characteristics of the semiconductor chips 23 is well maintained over a long period of time.

(4) By providing the adhesive sheet 12, the terminal case 10 with the external terminals 13 fixed therein is obtained without using a member such as a terminal fixing dowel likely to be an obstacle that hinders adhesion to the sealing resin. Therefore, separation between the sealing portion 40 and the external terminals 13 is prevented and the reliability of the semiconductor device 1 is improved.

(5) Conventionally, a mold is required to be used in two forming processes, i.e. a process of manufacturing in advance a terminal case with external terminals by insert molding using, external terminals, and a process of forming a sealing portion using a casting resin. However, in the semiconductor device manufacturing method in this embodiment, it is possible to omit the process of manufacturing in advance the terminal case with external terminals by the insert molding using the external terminals. That is, the formation using a mold is limited only to the formation of a sealing portion. Therefore, the semiconductor device 1 with high reliability is manufactured by simple processes.

(6) In a conventional semiconductor device manufacturing method, a process of applying an adhesive to a terminal case and adhering a circuit block to the terminal case is required. However, in the semiconductor device manufacturing method of this embodiment, adhesion of an adhesive sheet to a circuit block and to external terminals is performed at a time.

(7) By cutting external terminals in advance, it is possible to omit a tie bar cutting process.

Other Embodiments

While the present disclosure has been described with reference to the embodiment disclosed above, the description and drawings forming part of this disclosure should not be construed to limit the present disclosure. It should be understood that various alternative embodiments, examples, and application technologies will become clear to those skilled in the art from this disclosure.

The structure of a semiconductor device according to the present disclosure is not limited to what is described above, and can be changed as appropriate according to a desired specification. For example, the base of the terminal case of the semiconductor device illustrated in FIG. 1 is satisfactory provided that the adhesive sheet is provided between the support portion and the external terminals, and therefore, The external shapes of the support portion and the adhesive sheet can be changed to a shape other than a rectangular shape as appropriate. Further, the structure of the base and the shape of the external terminal can be changed as appropriate according to the function and structure of the semiconductor device.

Even by partially combining the structures of the semiconductor device illustrated in FIGS. 1 to 10B, a semiconductor device according to the present disclosure can be realized. As described above, the present disclosure includes various embodiments and so on not described above, and the technical scope of the present disclosure is defined only by invention specifying matters in the claims appropriate from the foregoing description.

DESCRIPTION OF REFERENCE SYMBOLS 1 semiconductor device
10 terminal case
11 base
11a support portion
11b, 11c side wall portion
11d opening
11e engaging groove
11f inner wall surface
11g inner wall surface
11h screw fastening hole
11i first surface
11j second surface
12 adhesive sheet
12a sheet portion
12b opening
12c recessed portion
12d cut-out portion
12e protruding portion
12f third surface
12g fourth surface
13 external terminal
14a, 14b fixing plate
14c engaging lug
20 circuit block
21 insulating substrate
22 conductor layer
23 semiconductor chip
30 control circuit chip
40 sealing portion
50a, 50b, 50c wire

What is claimed is:

1. A semiconductor device comprising:
   an insulating circuit substrate mounted with a semiconductor element;
   an external terminal;
   a base including a support portion;
   a premolded adhesive sheet; and
   a sealing portion covering the semiconductor element, wherein:
   the support portion has a first surface, a second surface on a side opposite to the first surface, and the support portion having a first opening extending from the first surface to the second surface, the insulating circuit substrate disposed in the first opening;
   the premolded adhesive sheet is disposed on the second surface of the support portion and the premolded adhesive sheet has a second opening in which the semiconductor element is disposed in plan view, the premolded adhesive sheet extending beyond the first opening in plan view, so that the premolded adhesive sheet adheres to the insulating circuit substrate; and
   the external terminal adheres to the premolded adhesive sheet and has a connecting surface to which a bonding wire is connected.

2. The semiconductor device according to claim 1, wherein:
   the premolded adhesive sheet has a third surface facing the second surface of the support portion;
   the premolded adhesive sheet has a fourth surface on a side opposite to the third surface; and
   the external terminal is adhered to the fourth surface of the premolded adhesive sheet.

3. The semiconductor device according to claim 2, wherein the premolded adhesive sheet is made of a resin material including an epoxy resin.

4. The semiconductor device according to claim 1, wherein the premolded adhesive sheet is made of a resin material including an epoxy resin.

5. The semiconductor device according to claim 1, wherein:
   the premolded adhesive sheet has a recessed portion on the fourth surface, the recessed portion having a shape corresponding to a shape of the external terminal; and
   the external terminal is disposed to be fitted into the recessed portion.

6. The semiconductor device according to claim 1, wherein the premolded adhesive sheet extends into the first opening along an entire periphery of the first opening in plan view, and an entire periphery of the second opening extends past an inner side of the first opening.

7. The semiconductor device according to claim 6, wherein a center of the first opening and a center of the second opening are aligned with each other.

8. The semiconductor device according to claim 1, wherein the insulating circuit substrate has a mounting surface on which the semiconductor element is mounted, the insulating circuit substrate is adhered closely to the premolded adhesive sheet at an outer peripheral portion of the mounting surface, and the semiconductor element is disposed in the second opening.

9. The semiconductor device according to claim 1, wherein:
   the support portion has a rectangular external shape; and
   the base has a first side wall portion and a second side wall portion, the first side wall portion and the second side wall portion respectively rising from two facing sides of the support portion.

10. The semiconductor device according to claim 9, further comprising a first fixing plate and a second fixing plate, the first fixing plate fixed to the first side wall portion and the second side wall portion, the second fixing plate fixed to the first side wall portion and the second side wall portion.

* * * * *

UNITED STATES PATENT AND TRADEMARK OFFICE
CERTIFICATE OF CORRECTION

PATENT NO. : 11,430,707 B2
APPLICATION NO. : 16/522038
DATED : August 30, 2022
INVENTOR(S) : Yuji Ichimura Page 1 of 1

It is certified that error appears in the above-identified patent and that said Letters Patent is hereby corrected as shown below:

In the Claims

Column 16, Line 61:
In Claim 10, delete "portion" and insert --portion, wherein a frame body is formed by the first side wall portion, the second side wall portion, the first fixing plate, and the second fixing plate.--

Signed and Sealed this
Twenty-seventh Day of August, 2024

Katherine Kelly Vidal
*Director of the United States Patent and Trademark Office*